United States Patent
Lee

(10) Patent No.: US 7,034,721 B2
(45) Date of Patent: Apr. 25, 2006

(54) APPARATUS AND METHOD FOR ADJUSTING SAMPLING CLOCK PHASE IN ANALOG-DIGITAL CONVERTER

(75) Inventor: In Ho Lee, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/971,797

(22) Filed: Oct. 22, 2004

(65) Prior Publication Data

US 2005/0088325 A1    Apr. 28, 2005

(30) Foreign Application Priority Data

Oct. 25, 2003   (KR) ...................... 10-2003-0074906

(51) Int. Cl.
*H03M 1/06*   (2006.01)

(52) U.S. Cl. ...................................... 341/118; 341/155

(58) Field of Classification Search ................ 341/155, 341/156, 122, 123, 124; 345/99, 213
See application file for complete search history.

(56) References Cited

U.S. PATENT DOCUMENTS

| 5,533,060 | A | * | 7/1996 | Kameo et al. ............... 375/332 |
| 5,910,651 | A | * | 6/1999 | Ryvkin ................... 235/462.25 |
| 6,483,447 | B1 | * | 11/2002 | Eglit .......................... 341/111 |

FOREIGN PATENT DOCUMENTS

| KR | 1996-0020008 | 6/1996 |
| KR | 0198610 B1 | 3/1999 |

\* cited by examiner

*Primary Examiner*—Brian Young
(74) *Attorney, Agent, or Firm*—Lee, Hong, Degerman, Kang & Schmadeka

(57) ABSTRACT

An apparatus and method for adjusting a sampling clock phase in an analog-digital converter are disclosed. The apparatus includes a window operation unit assigning at least one window to a sampled image, and calculating operation values for pixels corresponding to each window, a controller controlling analog-digital converter sampling clock phase control signals by using the calculated operation values for the pixels, and an analog-digital converter adjusting the phase of the analog-digital converter sampling clock depending upon the analog-digital converter sampling clock phase control signals.

19 Claims, 5 Drawing Sheets

APPARATUS AND METHOD FOR ADJUSTING SAMPLING CLOCK PHASE IN ANALOG-DIGITAL CONVERTER

This application claims the benefit of Korean Patent Application No. 10-2003-0074906, filed on Oct. 25, 2003, which is hereby incorporated by reference as if fully set forth herein.

BACKGROUND OF THE INVENTION

1. Field of the Invention

The present invention relates to an analog-digital converter, and more particularly, to an apparatus and method for adjusting a sampling clock phase in an analog-digital converter.

2. Discussion of the Related Art

Recently, as consumer demand for larger amount of information and higher picture quality has increased, digital televisions having such characteristics have been under development. The main function of such digital television is to simply display digital broadcast programs. However, as a multi-display device, the recently developed digital televisions also have other important functions, such as functioning as a monitor for displaying a personal computer (PC) screen and being connected to a conventional video equipment (e.g., a VCR, a DVD player, etc.) for display.

In order to eliminate distortion of such input video signals, many products adopting digital video interface methods, such as DVI interface or optical interface, are currently being developed and manufactured. However, due to various conventional video equipments that do not adopt the digital interface, or due to various video equipments adopting an analog interface, in display devices including digital televisions mostly receiving external inputs for display, analog-digital converters (ADCs) are used as important devices for converting analog signals to digital converters. When using such ADCs, deciding the phase of a sampling clock is an important factor for acquiring a digital video signal having no distortion. The importance of adjusting the phase of the sampling clock in an analog-digital converter (ADC) will now be described in detail with reference to the accompanying drawings.

FIGS. 1 to 3 illustrate sampling examples of an input signal in a general analog-digital converter. Referring to FIG. 1, the correspondence between the input signal and the clock of the ADC shows that a rising time of the clock may exist on a jitter region of the input signal. In this case, an unintended input signal value may be sampled. FIG. 2 illustrates an example of the input signal value being sampled at an ending point of the jitter region of the input signal. In this case, an instable input signal value may also be sampled. Finally, referring to FIG. 3, the rising time of the sampling clock is located in a stable section avoiding the jitter region of the input signal. In this case, since a stable input signal value is sampled, distortion of the data can be minimized.

As shown in FIGS. 1 and 3, by gradually modifying (or adjusting) the phase of the sampling clock, the ADC can compensate the phase. In order to adjust the sampling clock phase in the related art ADC, a method of calculating either an added value or a deviation value between a previous input pixel and a current input pixel for the entire input image. However, the method of calculating the added value of the deviation value between the previous input pixel and the current pixel for the entire input image is disadvantageous in that it may result in some limitations according to a pattern of the input image, and that the phase of the sampling clock may not be accurate. Thus, a problem of an instable conversion of an analog video signal to a digital video signal may occur in the related art ADC.

SUMMARY OF THE INVENTION

Accordingly, the present invention is directed to an apparatus and method for adjusting a sampling clock phase in an analog-digital converter that substantially obviates one or more problems due to limitations and disadvantages of the related art.

An object of the present invention is to provide an apparatus and method for adjusting a sampling clock phase in an analog-digital converter that can effectively correspond to any type of input image pattern, thereby effectively and stably adjusting a sampling clock phase.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an apparatus for adjusting a sampling clock phase of an analog-digital converter includes a window operation unit assigning at least one window to a sampled image, and calculating operation values for pixels corresponding to each window, a controller controlling analog-digital converter sampling clock phase control signals by using the calculated operation values for the pixels, and an analog-digital converter adjusting the phase of the analog-digital converter sampling clock depending upon the analog-digital converter sampling clock phase control signals.

Herein, the operation values for the pixels may be any one of an added value of pixel values and an added value of deviation values between the pixels. In addition, a position and a size of the window may be adjusted based on a user input, and the window may be positioned at a central area of the sampled image. Also, the operation values of the pixels may be calculated separately for each window or calculated simultaneously for all of the windows. And, the apparatus may also include a storage unit storing the operation values for the pixels corresponding to each window, the operation values being calculated from the window operation unit. And, a number of storage units used may be equal to a number of windows used.

The window operation unit may include a window generator generating at least one window, a window selector selecting any one of the at least one generated window, a first operation unit calculating the added value of pixel values corresponding to the selected window, and a second operation unit calculating the added value of the deviation values between each pixel corresponding to the selected window. Herein, the first operation unit may be a SUM accumulator.

Further, the second operation unit may include a delayer delaying the pixel values being inputted by one time unit, a subtracter calculating deviation values between the delayed pixel values from the delayer and the pixel values, an abs(−) obtaining absolute values for the deviation values calculated from the subtracter, and a DEV accumulator calculating an added value of the absolute values for the deviation values.

In another aspect of the present invention, a method for adjusting a sampling clock phase in an analog-digital converter includes sampling an image being inputted, assigning at least one window to the sampled image, calculating operation values for pixels corresponding to each window, and adjusting a phase of the sampling clock by using the calculated operation values for the pixels.

Herein, the assigning at least one window to the sampled image may include generating at least one window, and selecting any one of the at least one generated window. And, the calculating operation values for pixels corresponding to each window may include delaying the pixel values being inputted by one time unit, calculating deviation values between the delayed pixel values from the delayer and the pixel values, obtaining absolute values for the deviation values calculated from the subtracter, and calculating an added value of the absolute values for the deviation values or calculating an added value of the pixel values corresponding to the selected window.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
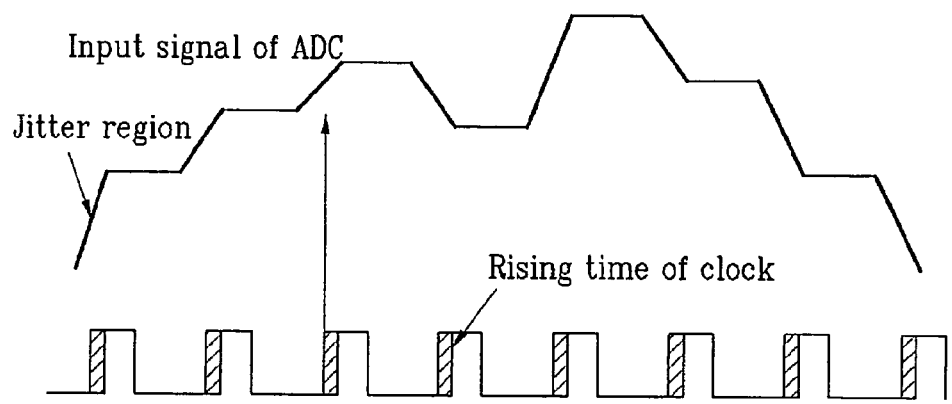
FIGS. 1 to 3 illustrate sampling examples of an input signal in a general analog-digital converter.
Figure 2:
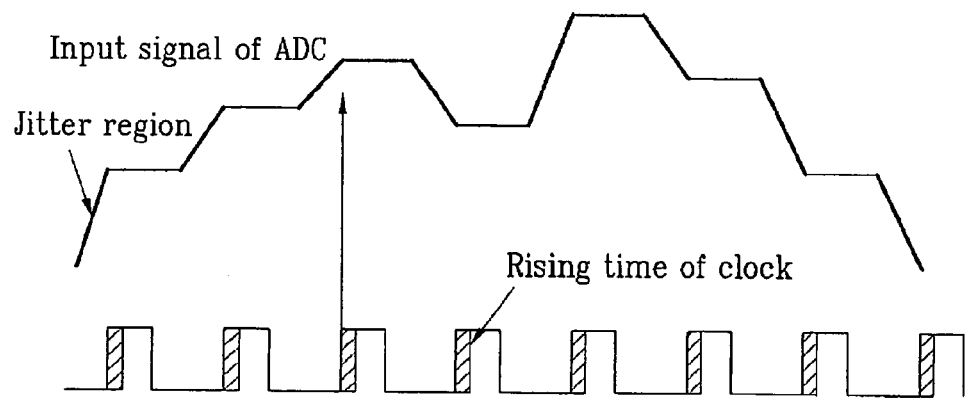
Figure 3:
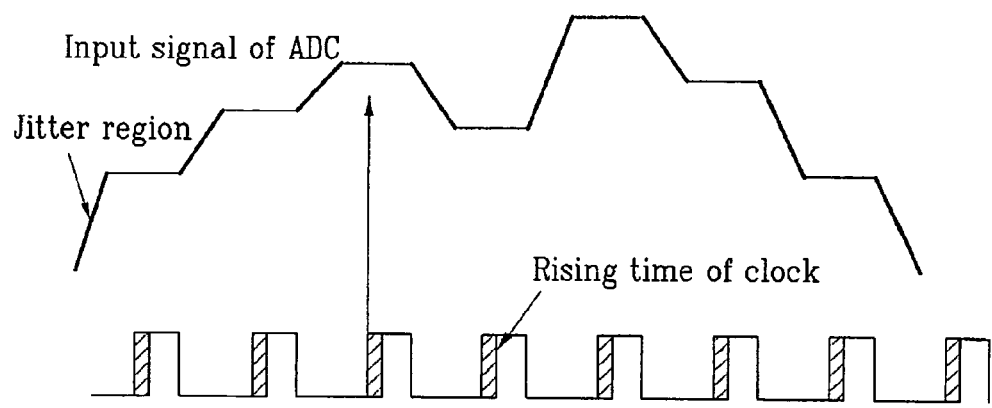
Figure 4:
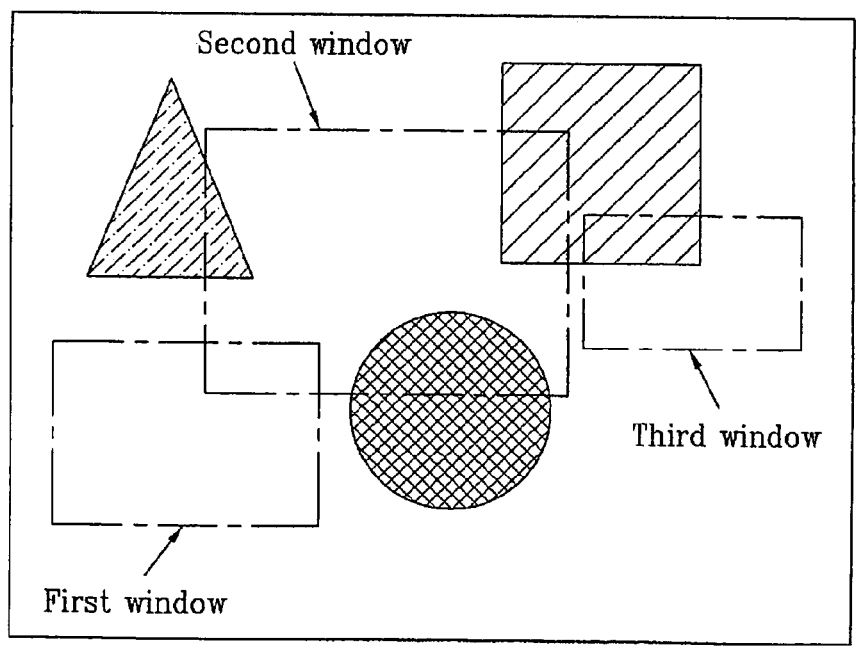
FIG. 4 illustrates a window for adjusting an analog-digital converter sampling clock phase according to the present invention.

FIG. 4 illustrates a window for adjusting an analog-digital converter sampling clock phase according to the present invention. The window according to the present invention is used for calculating (or obtaining) an added value of the pixels corresponding to the window, or for calculating the added value of the deviation values between each pixel, in order to decide the phase of the sampling clock of an input image. More specifically, as opposed to the related art method, which calculates either an added value or a deviation value between a previous input pixel and a current input pixel for the entire input image, the method according to the present invention uses the window to partially measure the pixel values for the entire input image with more precision, thereby accurately adjusting the phase of the sampling clock.

Referring to FIG. 4, when three (3) windows are used, no image is inputted in the first window, which may reduce the possibility of measuring an accurate phase. However, since the second and third windows are located in a portion where the image being inputted may be modified, the necessary information for measuring an accurate phase may be provided. More specifically, in the present invention, for each frame of the input image, the operation value of the pixels is measured by changing the position of the windows, such as the first, second, and third windows.

By changing the vertical and horizontal positions, as well as the size of the windows, an accurate operation value for the modified portion of the image can be measured. In addition, if the present invention determines the horizontal size and the vertical size of the window as the size of one pixel, the value of the pixel located in one specific position can be known. The method for calculating the operation values of the pixels for adjusting the sampling clock phase of the ADC according to the present invention by using such windows will now be described in detail with reference to the accompanying drawings.

Figure 5:
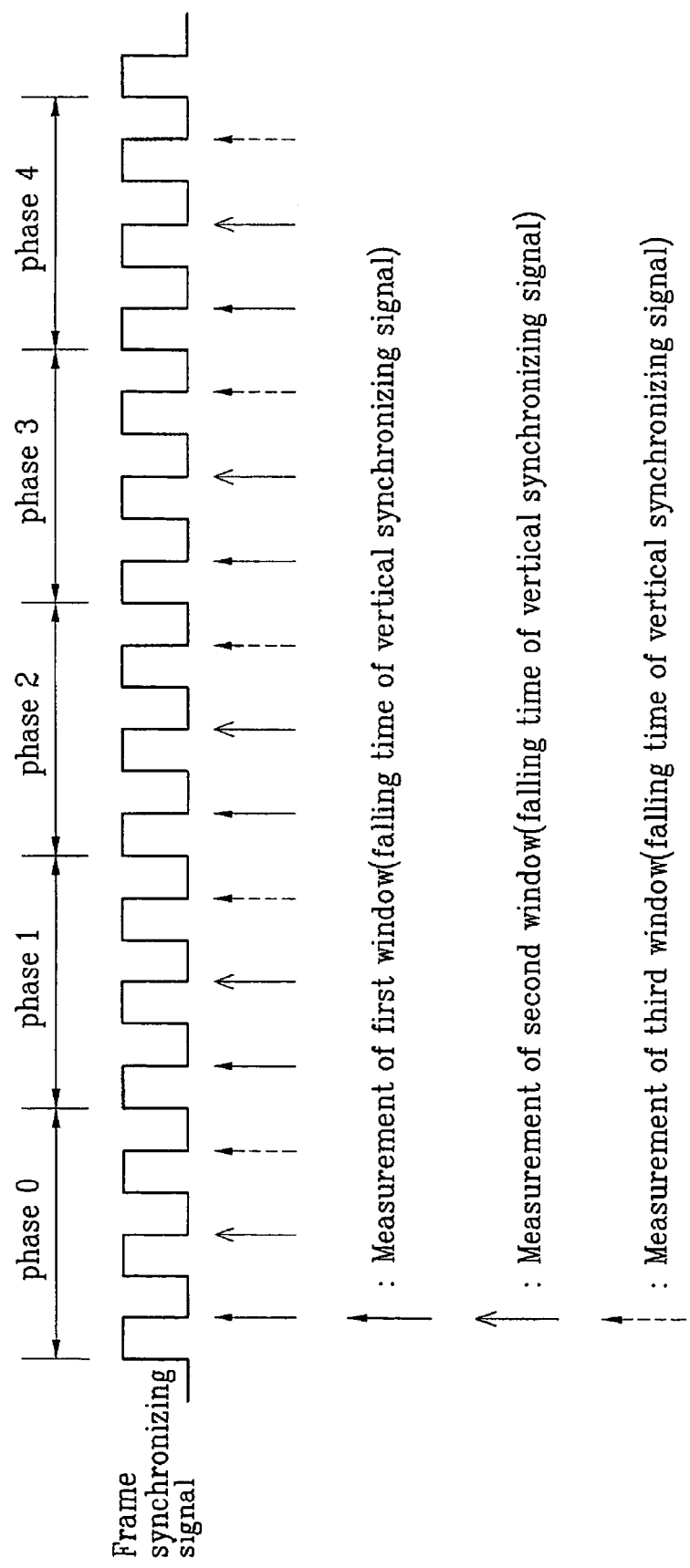
FIG. 5 illustrates a synchronizing signal for describing a method for adjusting the analog-digital converter sampling clock phase according to the present invention.

FIG. 5 illustrates a synchronizing signal for describing a method for adjusting the analog-digital converter sampling clock phase according to the present invention, wherein three (3) windows are used, as shown in FIG. 4. Referring to FIG. 5, three (3) windows positioned as shown in FIG. 4 are used for each frame synchronizing signal, so as to measure the operation value of each of the pixels. In FIG. 5, an ADC having five (5) phases is given as an example for simplicity of the description. The frame synchronizing signal refers to a vertical synchronizing signal of the input image. And, as shown in FIG. 5, the present invention can display a new value in a register at a falling time (i.e., a ending point for the input of an image) of the vertical synchronizing signal.

By using three (3) measurement windows for each frame synchronizing signal, the present invention stores the operation values of the pixels in the register. The present invention uses an ADC that can be adjusted to five (5) different phases and fixes the phase to 'phase 0'. Subsequently, among the three (3) windows, the present invention selects the first window and stores the operation values (i.e., the added value of all the pixel values or the added value of the deviation values between the pixels) of the pixels corresponding to the first window in the register. Thereafter, the present invention selects the second window and stores the operation values of the pixels corresponding to the second window in the register. And, finally, the present invention selects the third window and stores the operation values corresponding to the third window in the register.

Then, the present invention adjusts the phase to 'phase 1', and the operation values of the pixels are calculated as described above. Similarly, when the operation values corresponding to each of the five (5) phases are measured, a total of 5*3=15 operation values (i.e., the added value of the deviation values between the pixels for each window, or the added value of the pixels within each window) are stored in the register. In addition, the fifteen (15) operation values calculated by the present invention are used as reference values for deciding the sampling clock phase of the ADC by a set developer or an automatic phase-deciding program.

The method for using the operation values, such as the added values of the deviation values between the pixels for each window or the added values of the pixels within each window, in order to decide the sampling clock phase of the ADC will now be described in detail. An example of an image being represented by 8 bits and having a checkerboard structure of an alternated alignment of black and white colors, wherein the pixel value representing the black and white colors is either 0 or 255, will be used for simplicity of the description.

When an accurate sampling has been performed, the deviation value between neighboring (or adjacent) pixels becomes 255, and the added value of the deviation values is equal to half the size of a window, which is ½, being multiplied by the deviation value between each neighboring pixel, which is 255. However, as described above, if the sampling is not accurately performed and the sampling clock is positioned in the jitter region, then the value of the black and white pixels cannot be exactly equal to 0 or 255. Therefore, the added value of the deviation values between the pixels or the added value of the pixels cannot be accurately calculated. Accordingly, the present invention uses a plurality of windows to calculate the operation values of the pixels, and the set developer or the automatic phase-deciding program uses the calculated operation values to decide an accurate sampling clock phase.

If the present invention requires a wider range of operation values in order to decide the sampling clock phase with more precision, a larger number of windows may also be required accordingly. Also, in order to calculate the operation values more swiftly, a plurality of registers may be assigned to each window so that the operation values can be measured simultaneously. For example, when the registers are assigned to each window, the operation values of the pixels corresponding to the first, second, and third windows can be measured simultaneously at the ending time of one frame synchronizing signal, thereby obtaining the measurement three (3) times faster than when using a single register.

Figure 6:
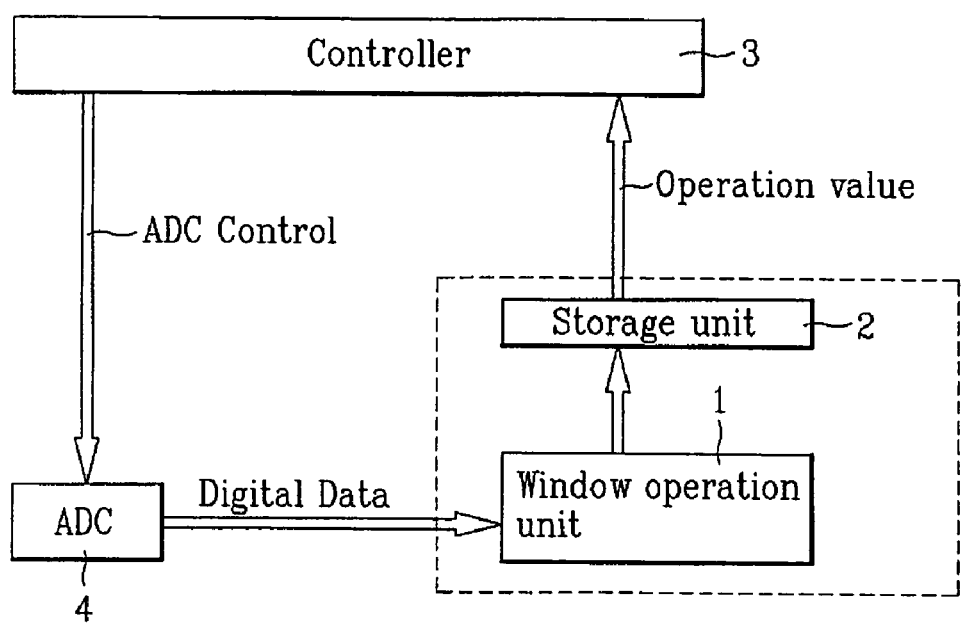
FIG. 6 illustrates an apparatus for adjusting an analog-digital converter sampling clock phase according to the present invention.

The structure of a hardware performing the method for adjusting the sampling clock phase in the analog-digital converter according to the present invention will now be described in detail. FIG. 6 illustrates an apparatus for adjusting an analog-digital converter sampling clock phase according to the present invention. Referring to FIG. 6, the present invention includes a window operation unit 1, a storage unit 2, a controller 3, and an analog-digital converter (ADC) 4. Herein, the window operation unit 1 assigns (or sets up) at least one window for a sampled image and calculates operation values for the pixels corresponding to each window.

Figure 7:
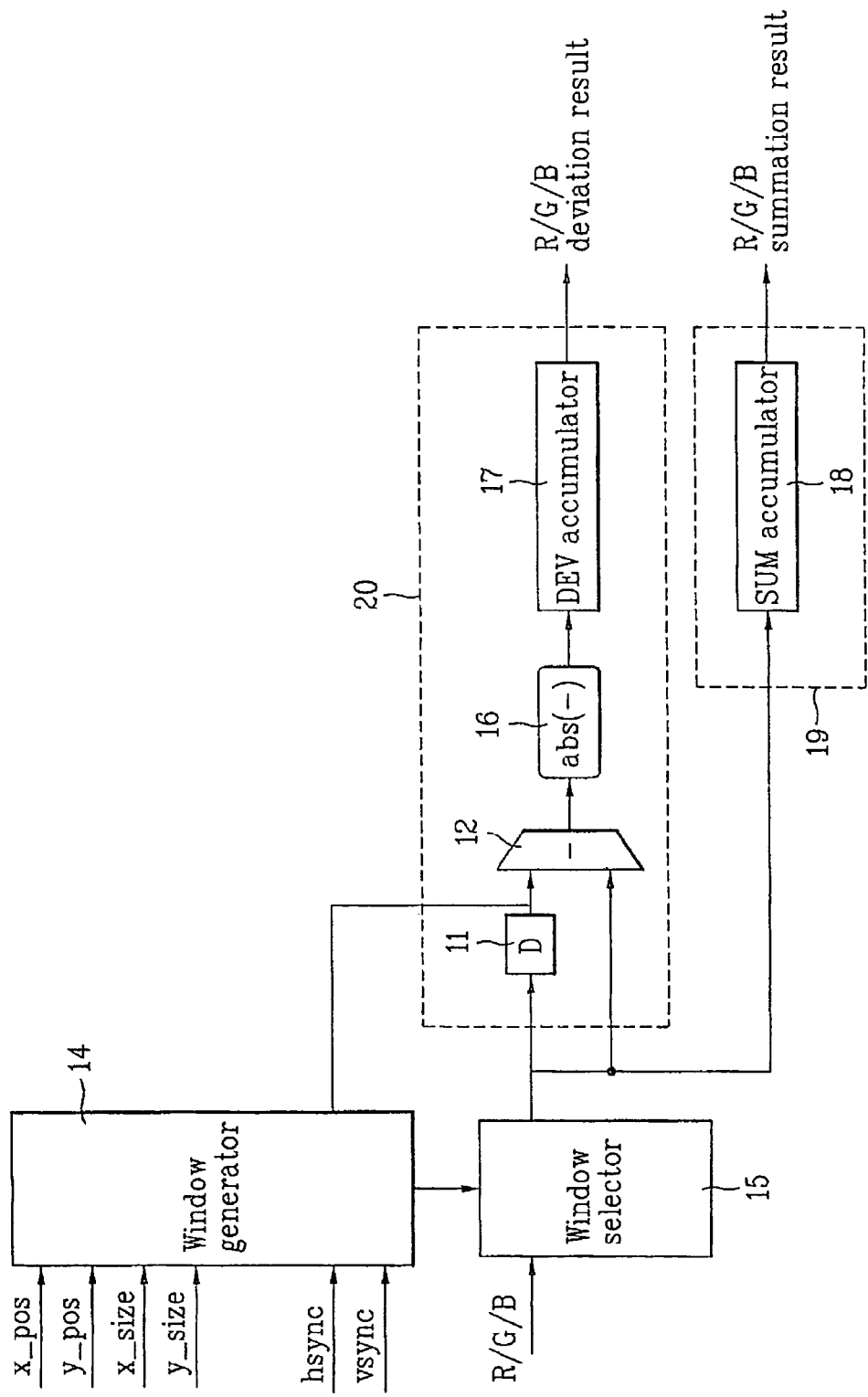
FIG. 7 illustrates a window operation part of FIG. 6.

Referring to FIG. 7, the window operation unit 1 includes a window generator 14 generating at least one window, a window selector 15 selecting any one of the at least one generated window, a first operation unit 19 calculating an added value of the pixel values corresponding to the selected window, and a second operation unit 20 an added value of the deviation values between each of the pixels corresponding to the selected window. Herein, the first operation unit 19 is a SUM accumulator 18. And, the second operation unit 20 includes a delayer 11 delaying the inputted pixel values by one time unit, a subtracter 12 calculating a deviation value between the delayed pixel values delayed from the delayer 11 and the pixel values, an abs(−) 16 obtaining an absolute value from the deviation values calculated from the subtracter 12, and a DEV accumulator 17 calculating an added value of the deviation values having the absolute values obtained.

The controller 3 generates ADC sampling clock phase control signals by using the operation values for each of the pixels. Subsequently, the ADC 4 samples the inputted image by adjusting the phase of the ADC sampling clock in accordance with the ADC sampling clock phase control signal. In the present invention, the operation values for the pixels can be any one of the added value of the deviation values between the pixels for each window and the added value of the pixel values within each window. Also, the position and the size of the window may be adjusted based on a user input, and it is preferable that the window is located at a central area of the sampled image. Moreover, the operation values of the pixels can be calculated separately for each window or simultaneously for all of the windows used. As a register, the storage unit 2 stores the operation values for the pixels corresponding to each window, which are calculated from the window operation unit 1. Herein, the number of storage units 2 can be equal to the number of windows.

The method for adjusting the sampling clock phase of the analog-digital converter (ADC) according to the present invention will now be described in detail. When the ADC 4 samples the image being inputted, the window generator 14 of the window operation unit 1 assigns at least one window for the sampled image. Subsequently, the window selector 15 of the window operation unit 1 selects one of the at least one generated window. Then, the first and second operation units 19 and 20 of the window operation unit 1 calculate the operation values for the pixels corresponding to each window.

Herein, the first operation unit 19 calculates the added value of the deviation values between the pixels for each window, and the second operation unit 20 calculates the added value of the deviation values between the pixels corresponding to each window. The second operation unit 20 delays the initially inputted pixel values by one time unit and calculates the deviation values between the delayed pixel values delayed from the delayer 11 and the pixel values. Subsequently, the second operation unit 20 obtains the absolute values for the deviation values calculated from the subtracter 12 and calculates the added value of the absolute values for each deviation value. Then, the operation values for the pixels, which are calculated from the first and second operation units 19 and 20, are stored in the storage unit 2. Finally, the controller 3 uses the operation values for the pixels, which are stored in the storage unit 2, so as to adjust the sampling clock phase of the ADC 4.

As described above, the apparatus and method for adjusting the sampling clock phase in the analog-digital converter according to the present invention has the following advantages.

By using a plurality of windows for calculating operation values for the pixels and by using the calculated operation values as reference values for deciding the sampling clock phase of the analog-digital converter, the sampling clock phase can be accurately adjusted and hardly any error occur when converting an analog video signal to a digital video signal. Furthermore, by applying the present invention to a component input terminal or a composite/S-video terminal of a display device, such as a digital television (DTV), or by applying the present invention to a D-Sub(RGBHV) image input terminal of a display device, such as a computer monitor, video data much approximate to the real object can be more efficiently displayed.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An apparatus for adjusting a sampling clock phase of an analog-digital converter, comprising:
 a window operation unit assigning at least one window to a sampled image, and calculating operation values for pixels corresponding to each window;
 a controller controlling analog-digital converter sampling clock phase control signals by using the calculated operation values for the pixels; and
 an analog-digital converter adjusting the phase of the analog-digital converter sampling clock depending upon the analog-digital converter sampling clock phase control signals.

2. The apparatus according to claim 1, wherein the operation values for the pixels are any one of an added value of pixel values and an added value of deviation values between the pixels.

3. The apparatus according to claim 1, wherein a position and a size of the window are adjusted based on a user input.

4. The apparatus according to claim 1, wherein the window is positioned at a central area of the sampled image.

5. The apparatus according to claim 1, wherein the operation values of the pixels is calculated separately for each window or calculated simultaneously for all of the windows.

6. The apparatus according to claim 1, further comprising a storage unit storing the operation values for the pixels corresponding to each window, the operation values being calculated from the window operation unit.

7. The apparatus according to claim 6, wherein the storage unit is a register.

8. The apparatus according to claim 6, wherein a number of storage units used is equal to a number of windows used.

9. The apparatus according to claim 1, wherein the window operation unit comprises:
 a window generator generating at least one window;
 a window selector selecting any one of the at least one generated window;
 a first operation unit calculating the added value of pixel values corresponding to the selected window; and
 a second operation unit calculating the added value of the deviation values between each pixel corresponding to the selected window.

10. The apparatus according to claim 9, wherein the first operation unit is a SUM accumulator.

11. The apparatus according to claim 9, wherein the second operation unit comprises:
 a delayer delaying the pixel values being inputted by one time unit;
 a subtracter calculating deviation values between the delayed pixel values from the delayer and the pixel values;
 an abs(−) obtaining absolute values for the deviation values calculated from the subtracter; and
 a DEV accumulator calculating an added value of the absolute values for the deviation values.

12. A method for adjusting a sampling clock phase in an analog-digital converter, comprising:
 sampling an image being inputted;
 assigning at least one window to the sampled image;
 calculating operation values for pixels corresponding to each window; and
 adjusting a phase of the sampling clock by using the calculated operation values for the pixels.

13. The method according to claim 12, wherein the operation values for the pixels are any one of an added value of pixel values and an added value of deviation values between the pixels.

14. The method according to claim 12, wherein a position and a size of the window are adjusted depending upon a user input.

15. The method according to claim 12, wherein the window is positioned at a central area of the sampled image.

16. The method according to claim 12, wherein the operation values of the pixels is calculated separately for each window or calculated simultaneously for all of the windows.

17. The method according to claim 12, further comprising, after calculating the operation values for the pixels corresponding to each window, storing the operation values for the pixels corresponding to each window.

18. The method according to claim 12, wherein the assigning at least one window to the sampled image comprises:
 generating at least one window; and
 selecting any one of the at least one generated window.

19. The method according to claim 12, wherein the calculating operation values for pixels corresponding to each window comprises:
 delaying the pixel values being inputted by one time unit;
 calculating deviation values between the delayed pixel values from the delayer and the pixel values;
 obtaining absolute values for the deviation values calculated from the subtracter; and
 calculating an added value of the absolute values for the deviation values or calculating an added value of the pixel values corresponding to the selected window.

* * * * *